United States Patent
Lee et al.

(10) Patent No.: US 9,954,008 B2
(45) Date of Patent: Apr. 24, 2018

(54) LIQUID CRYSTAL CELL PANEL INCLUDING SUBSTRATES HAVING CORNER PATTERNS

(71) Applicant: Samsung Display Co., Ltd., Yongin-Si, Gyeonggi-Do (KR)

(72) Inventors: Jun-hee Lee, Seoul (KR); Eoksu Kim, Seoul (KR); Wonjin Kim, Hwaseong-si (KR); Juyong Park, Asan-si (KR); Jungchul Woo, Seoul (KR); Hyunwook Lee, Busan (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 179 days.

(21) Appl. No.: 15/006,259

(22) Filed: Jan. 26, 2016

(65) Prior Publication Data
US 2016/0266457 A1    Sep. 15, 2016

(30) Foreign Application Priority Data
Mar. 13, 2015   (KR) .................. 10-2015-0035111

(51) Int. Cl.
*G02F 1/13* (2006.01)
*H01L 27/12* (2006.01)
(Continued)

(52) U.S. Cl.
CPC .......... *H01L 27/124* (2013.01); *G02F 1/1309* (2013.01); *G02F 1/133351* (2013.01);
(Continued)

(58) Field of Classification Search
CPC .............. H01L 27/124; G02F 1/1309; G02F 1/133351; G02F 1/1339; G02F 1/1341;
(Continued)

(56) References Cited

U.S. PATENT DOCUMENTS

| 6,731,368 B2* | 5/2004 | Yu ..................... G02F 1/1309 349/187 |
| 2003/0016326 A1* | 1/2003 | Hashimoto ........... G02F 1/1309 349/139 |

(Continued)

FOREIGN PATENT DOCUMENTS

| JP | 11-084353 A | 3/1999 |
| KR | 10-0557498 B1 | 2/2006 |

(Continued)

*Primary Examiner* — Nathanael R Briggs
(74) *Attorney, Agent, or Firm* — Cantor Colburn LLP

(57) ABSTRACT

A liquid crystal cell panel includes a first substrate from which is formed a thin film transistor array substrate, the first substrate including a plurality of unit cells and test terminals which respectively correspond to the unit cells, and a second substrate which faces the first substrate and from which is formed a color filter substrate. The first substrate further includes a first cutting pattern at each of a plurality of corners thereof, and the second substrate includes a second cutting pattern at each of a plurality of corners thereof, the second cutting patterns corresponding one-to-one with the first cutting patterns. Corresponding first and second cutting patterns cross each other in a plan view, and the crossing first and second cutting patterns expose a test terminal adjacent to the crossing first and second cutting patterns to outside the liquid crystal cell panel.

19 Claims, 6 Drawing Sheets

(51) Int. Cl.
  *G02F 1/1333*   (2006.01)
  *G02F 1/1341*   (2006.01)
  *G02F 1/1339*   (2006.01)
  *G09G 3/00*     (2006.01)
  *G02F 1/1362*   (2006.01)

(52) U.S. Cl.
  CPC .......... *G02F 1/1339* (2013.01); *G02F 1/1341* (2013.01); *G02F 2001/13415* (2013.01); *G02F 2001/136254* (2013.01); *G02F 2201/56* (2013.01); *G02F 2203/69* (2013.01); *G09G 3/006* (2013.01); *G09G 2330/12* (2013.01)

(58) Field of Classification Search
  CPC .......... G02F 2001/13415; G02F 2001/136254; G02F 2201/56; G02F 2203/69; G09G 3/006; G09G 2330/12
  See application file for complete search history.

(56) References Cited

U.S. PATENT DOCUMENTS

| | | | |
|---|---|---|---|
| 2007/0034522 A1* | 2/2007 | Park | G02F 1/136259 205/534 |
| 2009/0206334 A1* | 8/2009 | Yoon | G09G 3/006 257/48 |

FOREIGN PATENT DOCUMENTS

| | | |
|---|---|---|
| KR | 1020060083711 A | 7/2006 |
| KR | 10-0835972 B1 | 6/2008 |
| KR | 10-0898781 B1 | 5/2009 |

* cited by examiner

LIQUID CRYSTAL CELL PANEL INCLUDING SUBSTRATES HAVING CORNER PATTERNS

This application claims priority to Korean Patent Application No. 10-2015-0035111, filed on Mar. 13, 2015, and all the benefits accruing therefrom under 35 U.S.C. § 119, the entire contents of which are hereby incorporated by reference.

BACKGROUND (1) Field

The invention relates to a liquid crystal cell panel and a method of manufacturing the same.

(2) Description of the Related Art

Liquid crystal display apparatuses have attracted interest as technology-intensive and high value-added next-generation high-tech display devices with relatively low power consumption and good portability. Among these liquid crystal display apparatuses, active matrix type liquid crystal display apparatuses having thin film transistors which are switching elements capable of controlling the turning on/off of voltage of each pixel of the display apparatus, have attracted the most interest due to their excellent capability of implementing resolutions and moving pictures.

In general, a liquid crystal display apparatus is manufactured through a liquid crystal cell process in which liquid crystal is interposed between two substrates, after such substrates are provided in respective manufacturing processes thereof. For instance, a thin film transistor array substrate is provided through a thin film transistor array substrate manufacturing process, in which thin film transistors and pixel electrodes are formed in the thin film transistor array substrate, and a color filter substrate is provided through a color filter substrate manufacturing process in which a color filter and a common electrode are formed in the color filter substrate.

SUMMARY

One or more exemplary embodiments of the invention provide a liquid crystal cell panel including: a first substrate from which is formed a thin film transistor array substrate, the first substrate including a plurality of unit cells and test terminals which respectively correspond to the unit cells; and a second substrate which faces the first substrate and from which is formed a color filter substrate. The first substrate further includes a first cutting pattern at each of a plurality of corners thereof, and the second substrate includes a second cutting pattern at each of a plurality of corners thereof, the second cutting patterns corresponding one-to-one with the first cutting patterns. Corresponding first and second cutting patterns cross each other in a plan view, and the crossing first and second cutting patterns expose a test terminal adjacent to the crossing first and second cutting patterns to outside the liquid crystal cell panel.

The first and second substrates may have substantially the same polygonal shapes as each other respectively defined by the cutting patterns thereof and remaining sides thereof.

Each of the first and second substrates may have an octagonal shape.

The facing first and second substrates may have a vertically or laterally symmetrical relationship with each other in a plane.

The vertically symmetrical relationship may be a relationship in which when the first substrate is vertically inverted in the plane, the first substrate corresponds to the second substrate, and the laterally symmetrical relationship may be a relationship in which when the first substrate is laterally inverted in the plane, the first substrate corresponds to the second substrate.

An angle formed by the crossing first and second cutting patterns may be an obtuse angle.

The first substrate may further include a pixel electrode, and the second substrate may further include a common electrode.

Each of the plurality of unit cells may include a plurality of gate lines, a plurality of data lines and a plurality of thin film transistors.

The test terminals may include a gate line terminal connected to the plurality of gate lines, a data line terminal connected to the data lines and a common voltage terminal connected to the common electrode.

The liquid crystal cell panel may further include a liquid crystal layer between the first and second substrates.

The liquid crystal layer may be a liquid crystal material layer of one of the first and second substrates in a non-facing state with the other one of the first and second substrates.

In another embodiment of the invention, provided is a method of manufacturing a liquid crystal cell panel, the method including: forming an alignment film on a first substrate from which a thin film transistor substrate is formed or a second substrate from which a color filter substrate is formed, the first substrate including a plurality of unit cells in which a pixel region is defined, a first cutting pattern at each of a plurality of corners of the first substrate, and test terminals respectively corresponding to the first cutting patterns, the test terminals respectively connected to the unit cells, the second substrate including a second cutting pattern at each of a plurality of corners thereof, the second cutting patterns corresponding one-to-one with the first cutting patterns; forming a seal pattern and a spacer on the first substrate or the second substrate which includes the alignment film thereon; dropping liquid crystal material on the first substrate or the second substrate including the seal pattern thereon; assembling the substrate including the liquid crystal dropped thereon among the first and second substrate with the remaining substrate among the first and second substrate to form the liquid crystal cell panel in which corresponding first and second cutting patterns to cross each other in a plan view to expose a test terminal adjacent thereto; and testing the liquid crystal cell panel for defects through the exposed test terminal which is adjacent to the crossing first and second cutting patterns.

The first and second substrates may have substantially the same polygonal shape as each other respectively defined by the cutting patterns thereof and remaining sides thereof.

The first and second substrates may each have an octagonal shape.

The first and second substrates assembled with each other may have a vertically or laterally symmetrical relationship with each other in a plane.

The vertically symmetrical relationship may be a relationship in which when the first substrate is vertically inverted in the plane, the first substrate corresponds to the second substrate, and the laterally symmetrical relationship may be a relationship in which when the first substrate is laterally inverted in the plane, the first substrate corresponds to the second substrate.

An angle formed by the crossing first and second cutting patterns may be an obtuse angle.

The testing the liquid crystal cell panel for defects may include an on/off inspection apparatus applying a direct current voltage to the exposed test terminal which is adjacent to the crossing first and second cutting patterns.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1A:
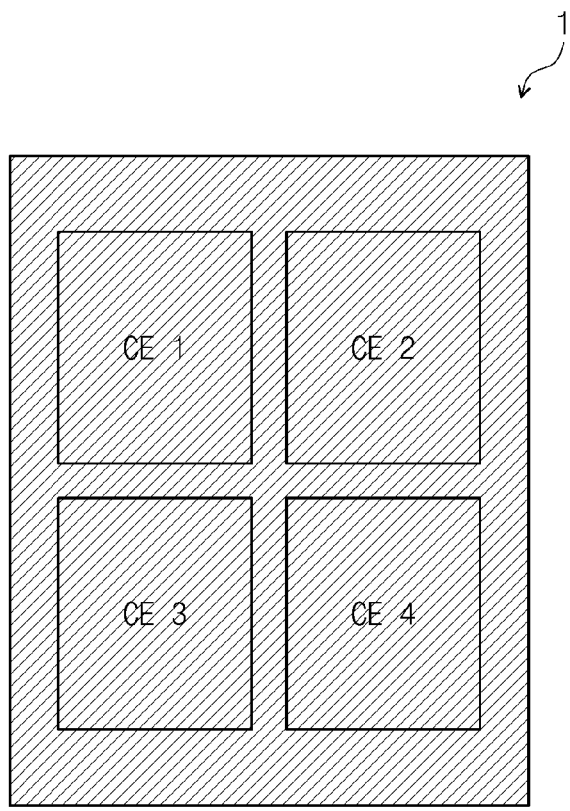
FIG. 1A is a front plan view of a conventional liquid crystal cell panel.

The terms used herein are selected from general terms widely used if possible in consideration of the functions herein. However, these may be changed according to the intent of a person of ordinary skill in the art, practice or the advent of new technologies. Also, in specific cases, there may be terms selected by the applicants, in which case, the meaning will be described in the detailed description of the corresponding embodiment. Thus, the terms used in the specification should not be understood simply as the names thereof, but should be understood based on actual meanings that are not the terms, and the entire contents of the specification. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Furthermore, hereinafter embodiments of the invention will be described in detail with reference to the accompanying drawings. However, it is to be understood that the invention is not limited to the embodiments described below.

In the liquid crystal cell process, liquid crystal is interposed between two substrates, after such substrates are provided in respective manufacturing processes thereof. The liquid crystal cell process may be characterized in that essentially no processes are repeated, in comparison with the respective thin film transistor array substrate manufacturing process or the color filter substrate manufacturing process. The entire liquid crystal cell process may be roughly divided into forming on one or more of the substrates an alignment layer which aligns liquid crystal molecules, forming a cell gap between the substrates, assembly of the substrates to form a liquid crystal cell panel, separating the liquid crystal cell panel into individual display cells, injecting liquid crystal into the display cells, and defect inspection of the display cells.

Typically, when the conventional thin film transistor array substrate and the conventional color filter substrate are assembled to each other, voltage is not applied to the thin film transistor array substrate. Thus, the liquid crystal cell panel is firstly separated into individual display cells through a scribing and breaking ("S/B") process, and the defect inspection for each separated display cell may be performed by application of voltage thereto.

Since the defect inspection is performed after completion of the S/B process, it is difficult to detect, in advance, defects in the thin film transistor array substrate and/or the color filter substrate. Thus, the efficiency of the liquid crystal cell process is decreased, and there is a limitation in that the repair of a defect through a rework process is difficult.

Hereinafter, exemplary embodiments of the invention will be described in more detail with reference to the accompanying drawings.

Figure 1B:
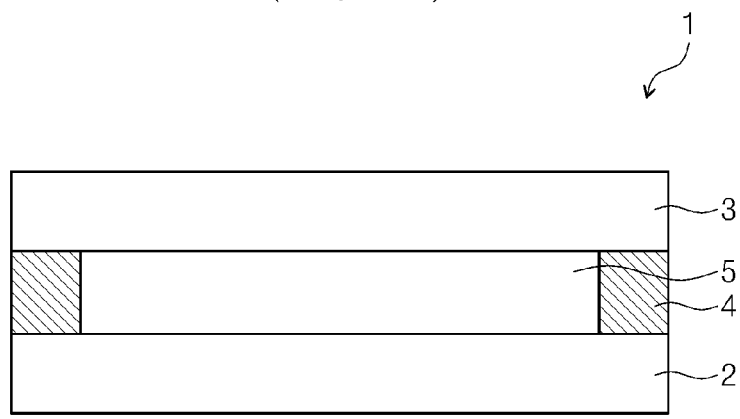
FIG. 1B is a cross-sectional view of the conventional liquid crystal cell panel in FIG. 1A.

FIG. 1A is a front plan view of a conventional liquid crystal cell panel, and FIG. 1B is a cross-sectional view of the conventional liquid crystal cell panel.

Referring to FIGS. 1A and 1B, the conventional liquid crystal cell panel 1 includes first and second substrates 2 and 3, and a liquid crystal layer 5 interposed between the first and second substrates 2 and 3.

The first substrate 2 may be a thin film transistor array substrate including a plurality of unit cells CE1 to CE4 defined therein. Each of the plurality of unit cells CE1 to CE4 may include a plurality of gate lines (not shown), a plurality of data lines (not shown) disposed to cross the gate lines and a plurality of pixel regions, on a first base substrate. In an exemplary embodiment, the crossing region of the gate lines and the data lines may be defined as a pixel region, but the invention is not limited thereto. Each of the plurality of unit cells CE1 to CE4 may further include in a pixel region, a thin film transistor connected to a gate line and a data line.

In the first substrate 2, a pixel electrode may be disposed on the first base substrate such as corresponding to the pixel region, and test terminals (not shown) for inspecting for operational defects in each of the unit cells CE1 to CE4 may be disposed on the first base substrate.

The second substrate 3 may be a color filter substrate facing the first substrate 2. In the second substrate 3, a red, green and blue ("RGB") color filter layer realizing red, green and blue colors may be disposed on a second base substrate, such as through a color filter process. Also, although not illustrated, a common electrode may be disposed on the second base substrate in the second substrate 3.

The first and second substrates 2 and 3 may be assembled to each other such as by a sealant 4, and a liquid crystal layer 5 may be disposed between the first and second substrates 2 and 3. In an exemplary embodiment of manufacturing the liquid crystal cell panel 1, the liquid crystal layer 5 may be disposed between the first and second substrates 2 and 3 through a liquid crystal material dropping method. An alignment film which aligns liquid crystal molecules of the liquid crystal layer 5 may be applied on the first and/or second substrates 2 and 3. Accordingly, when a predetermined voltage is applied to the plurality of pixel regions disposed in the first substrate 2, the liquid crystal molecules of the liquid crystal layer 5 may be aligned. According to the aligned states of the liquid crystal molecules of the liquid crystal layer 5, the amount of light transmitted through the liquid crystal layer 5 may be adjusted.

In general, glass substrates manufactured through an identical method are used as base substrates for manufacturing the first and second substrates 2 and 3. Accordingly, owing to the base substrates manufactured through an identical method, the first and second substrates 2 and 3 may have substantially the same shapes and sizes as each other. That is, the first and second substrates 2 and 3 are completely overlapped with each other, such that no portion of either one of the substrates 2 and 3 is exposed by the other one of the substrates 2 and 3. When a liquid crystal cell panel 1 is manufactured by assembling the first and second substrates 2 and 3 parallel to each other, there is a limitation in that directly testing for defects in the liquid crystal cell panel 1 may not be performed because test terminals of the first substrate 2 are not exposed to the outside.

Accordingly, in conventional methods, the testing for defects in the liquid crystal cell panel 1 for which the first and second substrates 2 and 3 may have substantially the same shapes and sizes as each other includes performing a visual inspection ("V/I") process for each unit cell CE1 to CE4 after performing the S/B process in which the liquid crystal cell panel 1, which is formed by assembling the first and second substrates 2 and 3, is separated into the unit cells CE1 to CE4. Since the V/I inspection is performed only after the liquid crystal cell panel 1 is separated into the unit cells CE1 to CE4, early detection of defects in the liquid crystal cell panel 1, such as in the first and/or second substrates 2 and 3, is difficult. In addition, since a defect test is performed after the liquid crystal cell panel 1 is separated into the unit cells CE1 to CE4, there is a limitation in that the process efficiency of manufacturing the liquid crystal cell panel 1 is decreased because a repair through a rework process is difficult.

To provide early detection of defects in a liquid crystal cell panel and to increase process efficiency of manufacturing the liquid crystal cell panel through an improved repair/rework process, one or more exemplary embodiments of the first and second substrates according to the invention may be manufactured by using respective base substrates which have the same basic shape as each other for which a cutting pattern is defined at every corner of each of the respective base substrates. As a result, although the first and second substrates are assembled in parallel, the test terminals on the first substrate are exposed by the second substrate to outside the assembled liquid crystal cell panel. Thus, earlier inspection of defects in the liquid crystal cell panel is provided, such as before completion of the S/B process.

Hereinafter, the base substrates of the first and second substrates, including first and second cutting patterns will be described in more detail.

Figure 2:
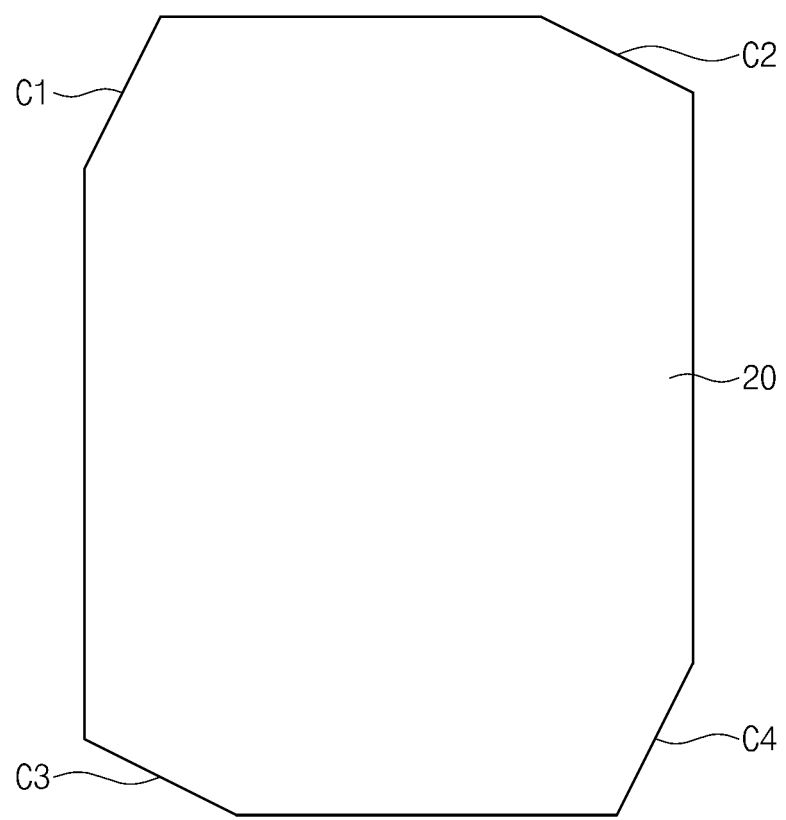
FIG. 2 is a front plan view of an exemplary embodiment of a base substrate used as a first or a second substrate of a liquid crystal cell panel according to the invention.

FIG. 2 is a front plan view of an exemplary embodiment of a base substrate used as the first and/or the second substrate of a liquid crystal cell panel according to the invention.

Referring to FIG. 2, a base substrate 20 used for manufacturing the base substrate of the first and/or second substrate of the invention has an overall rectangle shape and a cutting pattern among a plurality of cutting patterns C1 to C4 disposed at every corner thereof. Each of the cutting patterns C1 to C4 may have a straight line shape which forms an angle with a side or edge of the base substrate 20. The cutting patterns C1 to C4 respectively defined at the corners of the base substrate 20 may form angles with the side or edge of the base substrate 20 different from each other. Here, cutting patterns adjacent to each other in a vertical or horizontal direction among the plurality of cutting patterns C1 to C4 may not be parallel to each other, and cutting patterns adjacent to each other in a diagonal direction among the plurality of cutting patterns C1 to C4 may be parallel to each other.

The base substrate 20 may have a polygonal shape by the cutting patterns C1 to C4. In an exemplary embodiment, for example, the base substrate 20 may have an octagonal shape considering the sides of the base substrate 20 defined by the cutting patterns C1 to C4 and the remaining sides thereof.

A plurality of unit cells CE1 to CE4, test terminals and pixel electrodes are disposed and/or formed on the base substrate 20, so that the first substrate of a liquid crystal display cell may be manufactured. Alternatively, a color filter layer and a common electrode are disposed and/or formed on the base substrate 20, so that the second substrate of a liquid crystal display cell may be manufactured. Accordingly, the first and second substrates may have substantially the same shape as each other.

The first and second substrates may be assembled to have a vertically symmetrical relationship or a laterally symmetrical relationship with each other. As a result, although the first and second substrates are assembled with each other to form a liquid crystal display cell, a partial region of the first substrate, particularly a partial region in which the test terminals are located, may be exposed by the second substrate to the outside the liquid crystal cell panel. Accordingly, although an S/B process, in which the liquid crystal cell panel is separated into unit cells, is not performed, there is an effect in that testing for a defect in the liquid crystal cell panel may be performed using the test terminals exposed by the second substrate to the outside the liquid crystal cell panel. A more detailed description about this will be given below with reference to FIGS. 3A to 4.

Figure 3A:
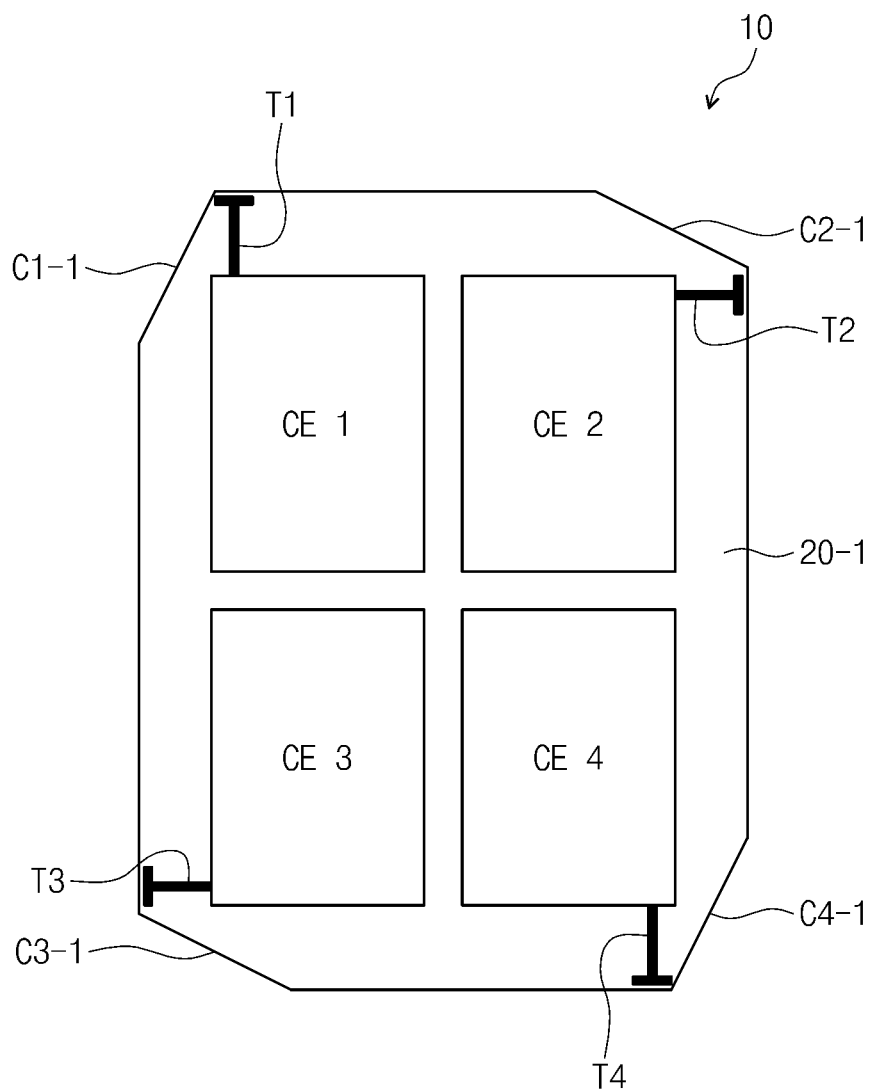
FIG. 3A is a front plan view of an exemplary embodiment of a first substrate of a liquid crystal cell panel, manufactured by using the base substrate of FIG. 2.
Figure 3B:
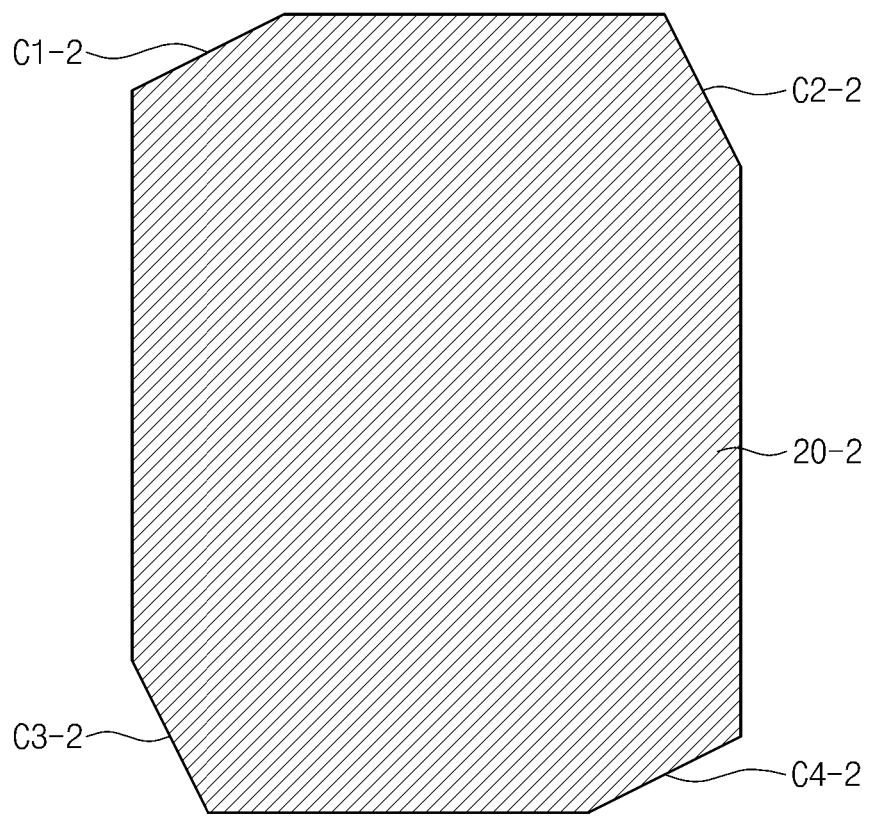
FIG. 3B is a front view of an exemplary embodiment of a second substrate of a liquid crystal cell panel, manufactured by using the base substrate of FIG. 2.
Figure 3C:
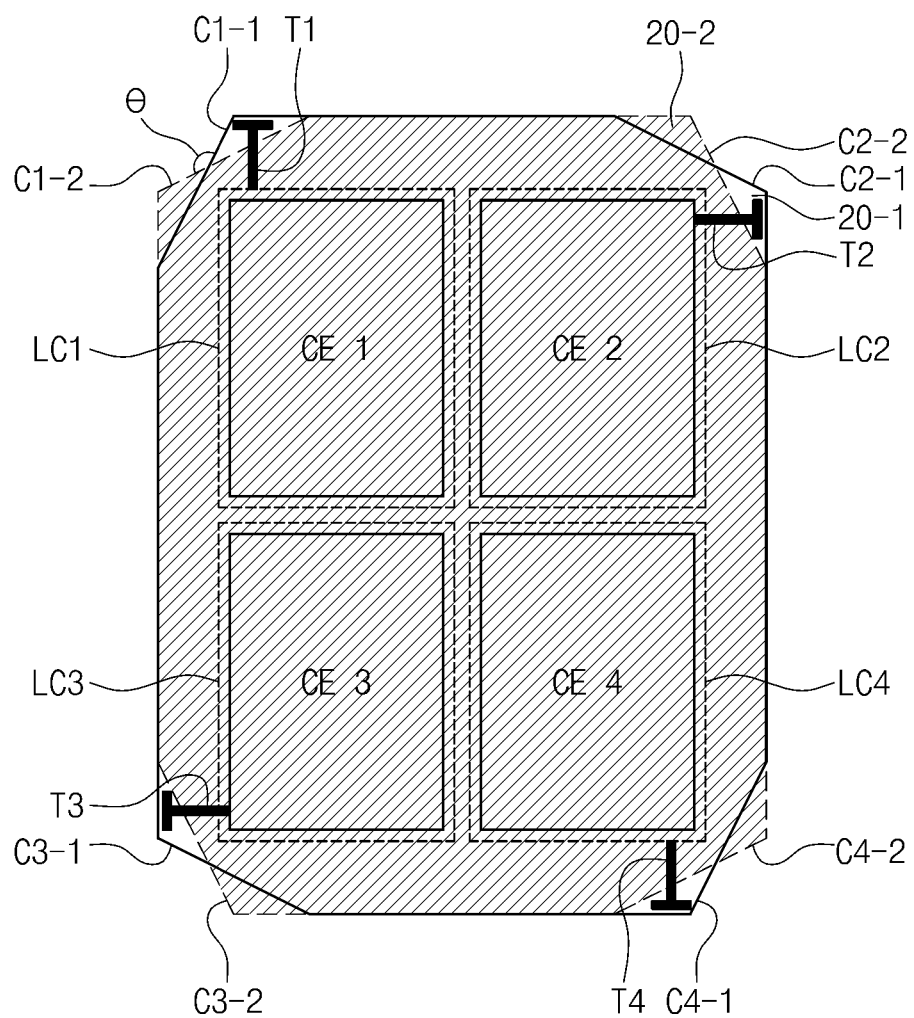
FIG. 3C is a front view of an exemplary embodiment of a liquid crystal cell panel manufactured by using the first substrate of FIG. 3A and the second substrate of FIG. 3B.

FIG. 3A is a front plan view of an exemplary embodiment of a first substrate of a liquid crystal cell panel, manufactured by using the base substrate of FIG. 2. FIG. 3B is a front plan view of an exemplary embodiment of a second substrate of a liquid crystal cell panel, manufactured by using the base substrate of FIG. 2. FIG. 3C is a front plan view of an exemplary embodiment of a liquid crystal cell panel manufactured by using the first substrate of FIG. 3A assembled with the second substrate of FIG. 3B.

Referring to FIG. 3A, the first substrate 20-1 may include a plurality of unit cells CE1 to CE4 disposed on the base substrate 20 of FIG. 2, test terminals T1 to T4 respectively corresponding to the plurality of unit cells CE1 to CE4, and first cutting patterns C1-1 to C4-1 respectively corresponding to the plurality of unit cells CE1 to CE4. In an exemplary embodiment, for example, the first substrate 20-1 may include, on the base substrate 20 of FIG. 2, first to fourth unit cells CE1 to CE4, the test terminals T1 to T4 respectively corresponding to the first to fourth unit cells CE1 to CE4, and the four first cutting patterns C1-1 to C4-1 respectively corresponding to the first to fourth unit cells CE1 to CE4. The front plan views of the base substrate 20 in FIG. 2 and the first substrate 20-1 in FIG. 3A, are the same, in that the cutting patterns C1 to C4 and angles formed thereby correspond one-to-one with the first cutting patterns C1-1 to C4-1, respectively.

Although not illustrated in the drawing, the test terminals T1 to T4 may include a gate line terminal, data line terminal and common voltage terminal. The gate line terminal may be connected to gate lines included in a corresponding unit cell. The data line terminal may be connected to data lines included in a corresponding unit cell. In particular, the gate line terminal may be connected to a gate shorting bar (not shown) to which the gate lines included in the corresponding unit cell are connected, and the data line terminal may be connected to a data shorting bar (not shown) to which the data lines included in the corresponding unit cell are connected, respectively. When the first and second substrates are assembled, the common voltage terminal may be connected to the common electrode of the second substrate.

Each of the test terminals T1 to T4 may extend from the corresponding unit cells CE1 to CE4 to the adjacent first cutting patterns C1-1 to C4-1. Each of the test terminals T1 to T4 extends outside of the corresponding unit cells CE1 to CE4 and toward the adjacent first cutting patterns C1-1 to C4-1 because when the first and second substrates are assembled with each other to form a liquid crystal cell panel, a region adjacent to the first cutting patterns is exposed to the outside the liquid crystal cell panel as first and second cutting patterns (to be described below) form a cross pattern. A more detailed description related to this will be given below with reference to FIG. 3C.

Referring to FIG. 3B, the second substrate 20-2 may include, on the base substrate 20 of FIG. 2, the color filter layer for realizing color lights, the common electrode corresponding to the pixel electrode of the first substrate 20-1, and second cutting patterns C1-2 to C4-2 which correspond one-to-one to the first cutting patterns C1-1 to C4-1. In an exemplary embodiment, the front plan view of the second substrate 20-2 in FIG. 3B is not that same as the front plan view of the base substrate 20 in FIG. 2. The front plan view of the second substrate 20-1 in FIG. 3B corresponds to a rear plan view of the base substrate 20 in FIG. 2, such that cutting patterns C1, C2, C3 and C4 correspond one-to-one with the first cutting patterns C2-2, C1-2, C4-2 and C3-2, respectively.

Referring to FIG. 3C, the first and second substrates 20-1 and 20-2 may form a liquid crystal cell panel 10 by being assembled to have a vertically or laterally symmetrical relationship in a plane. The front surface of the second substrate 20-2 (viewable in FIG. 3B) is disposed to face a rear surface of the first substrate 20-1 (not viewable in FIG. 3A). Here, the vertically symmetrical relationship denotes a relationship in which the first substrate 20-1 corresponds to the second substrate 20-2 when vertically inverted in a plane. Also, the laterally symmetrical relationship denotes a relationship in which the first substrate 20-1 corresponds to the second substrate 20-2 when laterally inverted in a plane. Referring to the plan view of FIG. 3C, for example, upper and lower side edges of the first and second substrates 20-1 and 20-2 in a vertical direction of the plan view coincide with each other to have the vertically symmetrical relationship. Similarly, referring again to the plan view of FIG. 3C, for example, left and right side edges of the first and second substrates 20-1 and 20-2 in a horizontal (e.g., lateral) direction of the plan view coincide with each other to have the lateral symmetrical relationship.

As the first and second substrates 20-1 and 20-2 are assembled to have a vertically or laterally symmetrical relationship, the first and second cutting patterns C1-1 to C4-1 and C1-2 to C4-2 that correspond to one another may cross each other in a plane to form a cross pattern. Here, an angle θ defined by a pair of crossing first and second cutting patterns C1-1 to C4-1 and C1-2 to C4-2 may be an obtuse angle. The test terminals T1 to T4 adjacent to the first cutting patterns C1-1 to C4-1 of the first substrate 20-1 may be exposed by the second substrate 20-1 to the outside of the assembled liquid crystal cell panel 10 as the pairs of crossing first and second cutting patterns C1-1 to C4-1 and C1-2 to C4-2 form respective cross patterns.

When the first and second substrates 20-1 and 20-2 are assembled to form the liquid crystal cell panel 10, the liquid crystal cell panel 10 may have defined therein liquid crystal display cells LC1 to LC4 corresponding to the unit cells CE1 to CE4 of the first substrate 20-1. Each of the liquid crystal display cells LC1 to LC4 may include the unit cells CE1 to CE4, a color filter layer corresponding to the unit cells unit cells CE1 to CE4, and a liquid crystal layer 5 corresponding to the unit cells CE1 to CE4. The liquid crystal display cells LC1 to LC4 thus defined in the liquid crystal cell panel 10 may each be tested for defects through the test terminals T1 to T4 respectively connected to the unit cells CE1 to CE4 included therein. A more detailed description about this will be given below with reference to FIG. 4.

Figure 4:
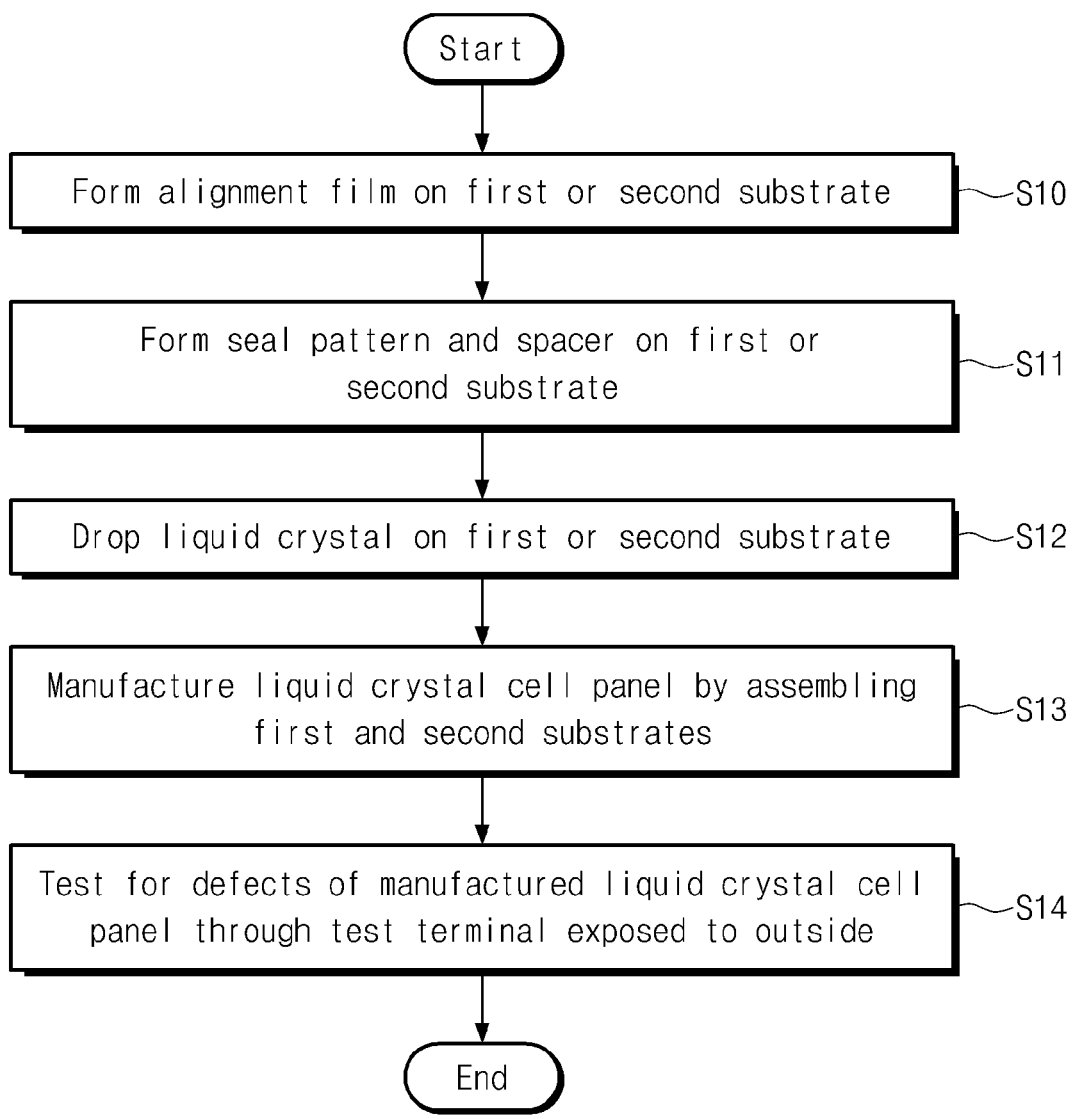
FIG. 4 is a flow chart illustrating an exemplary embodiment of a method of manufacturing a liquid crystal cell panel according to the invention.

FIG. 4 is a flow chart illustrating an exemplary embodiment of a method of manufacturing a liquid crystal cell panel according to the invention. Like reference numerals in the above description with reference to FIGS. 1 to 3C refer to the same elements described in the flow chart.

Referring to FIG. 4, an alignment film may be formed on the first and second substrates 20-1 and 20-2 having thereon elements such as a plurality of gate lines (not shown), a plurality of data lines (not shown) disposed to cross the gate lines, a plurality of pixel regions, a pixel electrode, test terminals, a color filter, a common electrode, etc. (S10). The forming the alignment film may include printing an alignment film including or formed of a polymer thin film on the first and second substrates 20-1 and 20-2 having the elements thereon, and rubbing a surface of the alignment film. The rubbing a surface of the alignment film may include a process which rubs the alignment film in a predetermined direction such as by using a rubbing cloth, such that liquid crystal molecules of the liquid crystal layer subsequently formed are aligned along the rubbing direction.

A seal pattern and a spacer may be formed on the first or second substrate 20-1 or 20-2 having the elements and/or the alignment film thereon. The spacer functions to maintain a cell gap between the first and second substrates 20-1 and 20-2 having the elements and/or the alignment film thereon (S11). A single individual seal pattern may be formed for each of the unit cells CE1 to CE4. The single individual seal patterns respectively form cell gaps in which liquid crystal material is disposed and to reduce or effectively prevent leakage of the liquid crystal from the cell gaps.

Liquid crystal material may be dropped on the first and/or second substrate 20-1 or 20-2 having the elements and/or the alignment film thereon (S12). The liquid crystal material may be dropped on the first and/or second substrate 20-1 or 20-2 having the elements and/or the alignment film thereon, and on which are formed the seal pattern. The liquid crystal material may be dropped on the first and/or second substrate 20-1 or 20-2 through a dropping method to form a liquid crystal layer 5. In particular, the liquid crystal material may be dropped on the substrate on which the seal pattern and the spacer are formed among the first and second substrate 20-1 or 20-2. In an exemplary embodiment, for example, when the seal pattern and the spacer are formed on the second substrate 20-2 in operation S11, the second substrate 20-2 may be mounted inside a vacuum chamber and the liquid crystal may be dropped inside the seal pattern of the second substrate 20-2.

The liquid crystal cell panel 10 may be manufactured by assembling the first and second substrates 20-1 and 20-2 with each other (S13). In operation S13, a substrate on which the liquid crystal is dropped among the first and second substrate 20-1 or 20-2 and the remaining substrate are assembled with each other to thus form the liquid crystal cell panel 10. More specifically, the remaining substrate is disposed on the substrate on which the liquid crystal is dropped, to face the substrate on which the liquid crystal is dropped. The facing substrates are pressed, so that excess liquid crystal material dropped on the respective substrate is discharged, and the two substrates are fixedly assembled such as through heat treatment and/or curing of the seal pattern.

Here, the first and second substrates 20-1 and 20-2 may be assembled with each other such that mutually corresponding first and second cutting patterns C1-1 to C4-1 and C1-2 to C4-2 cross each other to form a cross pattern. Accordingly, the first and second substrates 20-1 and 20-2 may be assembled to face each other to have a vertically or laterally symmetrical relationship. Here, an angle θ defined by crossing pairs of the first and second cutting patterns C1-1 to C4-1 and C1-2 to C4-2 may be an obtuse angle. As the first and second cutting patterns C1-1 to C4-1 and C1-2 to C4-2 corresponding to each other form a cross pattern, the test terminals T1 to T4 respectively corresponding to the unit cells CE1 to CE4 may be exposed to outside of the liquid crystal cell panel 10.

Through the test terminals T1 to T4 exposed to outside of the liquid crystal cell panel 10, the manufactured liquid crystal cell panel 10 may be tested for defects (S14). The liquid crystal cell panel 10 may include defined therein liquid crystal display cells LC1 to LC4 corresponding to the unit cells CE1 to CE4 of the first substrate 20-1. Each of the liquid crystal display cells LC1 to LC4 may include the unit cells CE1 to CE4 of the first substrate 20-1, a color filter layer of the second substrate 20-1 corresponding to the unit cells CE1 to CE4, and a liquid crystal layer 5 between the first and second substrates 20-1 and 20-2 corresponding to the unit cells CE1 to CE4. The liquid crystal display cells LC1 to LC4 thus formed may be tested for defects through the test terminals T1 to T4 respectively connected to the unit cells CE1 to CE4 included therein.

The testing of the liquid crystal display cells LC1 to LC4 for defects includes supplying voltage through the connected test terminals T1 to T4 to drive the liquid crystal display cells LC1 to LC4. In driving the liquid crystal display cells LC1 to LC4, testing may be performed to detect defects in conductive or signal lines, such as electrical shorts and disconnections in the lines included in each of the unit cells CE1 to CE4, or to detect resultant defects in the operation of thin film transistors. The testing of the liquid crystal display cells LC1 to LC4 for defects may include supplying a direct current voltage to the test terminals T1 to T4 such as by using an on/off inspection apparatus.

Although not illustrated, when defects in the liquid crystal display cells LC1 to LC4 of the assembled liquid crystal cell panel 10 are not detected through the defect testing (S14), a liquid crystal display device may be manufactured by machining, cutting and/or separating the liquid crystal cell panel 10 into individual liquid crystal display cells LC1 to LC4 defining a plurality of liquid crystal panels. Conversely, when a defect in at least one of the liquid crystal display cells LC1 to LC4 of the assembled liquid crystal cell panel 10 is detected through the defect testing (S14), the defect may be removed by finding and repairing the cause thereof within the liquid crystal cell panel 10 before machining, cutting and/or separating the liquid crystal cell panel 10 into individual liquid crystal display cells LC1 to LC4 defining a plurality of liquid crystal panels.

Thus, since early testing for defects within the liquid crystal cell panel 10 during a manufacturing process of the liquid crystal cell panel 10 is made possible, the early detection of product defects is possible, early repair through a rework process is possible, and the manufacturing efficiency of the liquid crystal cell panel 10 is improved.

According to one or more exemplary embodiments of the invention, since defects in a liquid cell panel may be detected early, production yield in manufacturing liquid crystal cell panels may be improved and the manufacturing cost for liquid crystal cell panels may be reduced.

Although each drawing is individually described for convenience of description, it is possible to combine the exemplary embodiments described in each drawing and design and implement a new embodiment. Also, the display apparatus may not be limited to the configuration and methods of the embodiments as mentioned above, and the above-mentioned embodiments may also be configured such that all or a part of each exemplary embodiment may be selectively combined and various modifications could thus be achieved.

Furthermore, although exemplary embodiments are illustrated and described above, the specification is not limited to a specific embodiment mentioned above. Various modifications are possible by those skilled in the art without departing from the spirit and scope of the claims. Also, such modifications should not be understood to be separate from the spirit and scope of the invention.

What is claimed is:

1. A liquid crystal cell panel, comprising:
   a first substrate from which is formed a thin film transistor array substrate, the first substrate comprising:
   a plurality of unit cells in which a pixel region is defined;
   test terminals which respectively correspond to the unit cells; and
   a first cutting pattern at each of a plurality of corners of the first substrate, the test terminals respectively adjacent to the first cutting patterns; and
   a second substrate which faces the first substrate and from which is formed a color filter substrate, the second substrate comprising a second cutting pattern at each of a plurality of corners thereof, the second cutting patterns in one-to-one correspondence with the first cutting patterns of the first substrate,
   wherein
   corresponding first and second cutting patterns cross each other in a plan view, and
   the crossing first and second cutting patterns expose a test terminal adjacent to the crossing first and second cutting patterns to outside the liquid crystal cell panel.

2. The liquid crystal cell panel of claim 1, wherein the first and second substrates have a substantially same polygonal shape respectively defined by the cutting patterns thereof and remaining sides thereof.

3. The liquid crystal cell panel of claim 2, wherein each of the first and second substrates have an octagonal shape.

4. The liquid crystal cell panel of claim 2, wherein the facing first and second substrates have a vertically or laterally symmetrical relationship with each other in a plane.

5. The liquid crystal cell panel of claim 4, wherein
   the vertically symmetrical relationship is a relationship in which when the first substrate is vertically inverted in the plane, the first substrate corresponds to the second substrate, and
   the laterally symmetrical relationship is a relationship in which when the first substrate is laterally inverted in the plane, the first substrate corresponds to the second substrate.

6. The liquid crystal cell panel of claim 2, wherein an angle formed by the crossing first and second cutting patterns is an obtuse angle.

7. The liquid crystal cell panel of claim 1, wherein
   the first substrate further comprises a pixel electrode, and
   the second substrate further comprises a common electrode.

8. The liquid crystal cell panel of claim 7, wherein each of the plurality of unit cells comprises:
   a plurality of gate lines,
   a plurality of data lines, and
   a plurality of thin film transistors.

9. The liquid crystal cell panel of claim 8, wherein the test terminal comprises:
   a gate line terminal connected to the plurality of gate lines,
   a data line terminal connected to the data lines, and
   a common voltage terminal connected to the common electrode.

10. The liquid crystal cell panel of claim 1, further comprising a liquid crystal layer between the first substrate facing the second substrate.

11. The liquid crystal cell panel of claim 10, wherein the liquid crystal layer is a liquid crystal material layer of one of the first and second substrates in a non-facing state with the other one of the first and second substrates.

12. A method of manufacturing a liquid crystal cell panel, comprising:
    forming an alignment film on a first substrate from which a thin film transistor array substrate is formed or a second substrate from which a color filter substrate is formed,
    the first substrate comprising:
    a plurality of unit cells in which a pixel region is defined;
    a first cutting pattern at each of a plurality of corners thereof, and
    test terminals respectively corresponding to the first cutting patterns, the test terminals respectively connected to the unit cells,
    the second substrate comprising:
    a second cutting pattern at each of a plurality of corners thereof, the second cutting patterns corresponding one-to-one with the first cutting patterns;
    forming a seal pattern and a spacer on the first substrate or the second substrate which includes the alignment film thereon;
    dropping liquid crystal material on the first substrate or the second substrate which includes the seal pattern thereon;
    assembling the substrate including the liquid crystal dropped thereon among the first and second substrates with the remaining substrate among the first and second substrates to form the liquid crystal cell panel in which corresponding first and second cutting patterns to cross each other in a plan view to expose a test terminal adjacent thereto; and
    testing the liquid crystal cell panel for defects through the exposed test terminal which is adjacent to the crossing first and second cutting patterns.

13. The method of claim 12, wherein the first and second substrates have a substantially same polygonal shape respectively defined by the cutting patterns thereof and remaining sides thereof.

14. The method of claim 13, wherein each of the first and second substrates have an octagonal shape.

15. The method of claim 13, wherein the first and second substrates assembled with each other have a vertically or laterally symmetrical relationship with each other in a plane.

16. The method of claim 15, wherein
    the vertically symmetrical relationship is a relationship in which when the first substrate is vertically inverted in the plane, the first substrate corresponds to the second substrate, and
    the laterally symmetrical relationship is a relationship in which when the first substrate is laterally inverted in the plane, the first substrate corresponds to the second substrate.

17. The method of claim 15, wherein an angle formed by the crossing first and second cutting patterns is an obtuse angle.

18. The method of claim 12, wherein the testing the liquid crystal cell panel for defects comprises an on/off inspection apparatus applying a direct current voltage to the exposed test terminal which is adjacent to the crossing first and second cutting patterns.

19. The method of claim 12, wherein the testing the liquid crystal cell panel for defects is performed before separating the unit cells of liquid crystal cell panel from each other to respectively form display cells from the separated unit cells.

* * * * *